United States Patent
Butler et al.

(10) Patent No.: US 8,059,259 B2
(45) Date of Patent: Nov. 15, 2011

(54) DAMPING ARRANGEMENT, ACTIVE DAMPING SYSTEM, LITHOGRAPHIC APPARATUS, AND PROJECTION ASSEMBLY

(75) Inventors: Hans Butler, Best (NL); Marc Wilhelmus Maria Van Der Wijst, Veldhoven (NL); Joost De Pee, Veldhoven (NL); Cornelius Adrianus Lambertus De Hoon, Best (NL); Stijn Boschker, Pijnacker (NL)

(73) Assignee: ASML Netherlands B.V., Veldhoven (NL)

( * ) Notice: Subject to any disclaimer, the term of this patent is extended or adjusted under 35 U.S.C. 154(b) by 454 days.

(21) Appl. No.: 12/268,622

(22) Filed: Nov. 11, 2008

(65) Prior Publication Data

US 2009/0207393 A1 Aug. 20, 2009

Related U.S. Application Data

(60) Provisional application No. 60/996,502, filed on Nov. 20, 2007.

(51) Int. Cl.
 *G03B 27/52* (2006.01)
(52) U.S. Cl. .......................................... 355/53
(58) Field of Classification Search ...................... 355/53
 See application file for complete search history.

(56) References Cited

U.S. PATENT DOCUMENTS

| 4,999,534 | A * | 3/1991 | Andrianos | 310/90.5 |
| 6,441,884 | B1 * | 8/2002 | Takahashi et al. | 355/53 |
| 6,462,828 | B1 * | 10/2002 | Takeishi | 356/500 |
| 2003/0197914 | A1 | 10/2003 | Cox et al. | |
| 2005/0224687 | A1 | 10/2005 | Heertjes et al. | |
| 2007/0144842 | A1 * | 6/2007 | Zhou | 188/267 |
| 2009/0051889 | A1 * | 2/2009 | Ishikawa | 355/44 |

FOREIGN PATENT DOCUMENTS

| JP | 09-004677 A | 1/1997 |
| JP | 2001-027280 A | 1/2001 |
| JP | 2003-203860 A | 7/2003 |
| JP | 2005-315426 A | 11/2005 |

OTHER PUBLICATIONS

English language Abstract of Japanese Patent Publication No. JP 09-004677 A, Japanese Patent Office, Patent & Utility Model Gazette DB, (1997).
English language Abstract of Japanese Patent Publication No. JP 2001-027280 A, Japanese Patent Office, Patent & Utility Model Gazette DB, (2001).
English language Translation of Notice of Reasons for Rejection for Japanese Patent Application No. JP 2008-290443, mailed on Sep. 27, 2010.
Van Der Wijst et al., "Lithographic Apparatus, Projection Assembly and Active Damping", U.S. Appl. No. 12/244,879, filed Oct. 3, 2008, 15 pgs.

* cited by examiner

*Primary Examiner* — Hung Henry Nguyen
*Assistant Examiner* — Michelle Iacoletti
(74) *Attorney, Agent, or Firm* — Sterne, Kessler, Goldstein & Fox P.L.L.C.

(57) ABSTRACT

An active damping system assembly is configured to dampen a vibration of at least part of a structure. The assembly includes a plurality of active dampers each including a sensor configured to measure a position quantity of an interface mass mounted on the structure; and an actuator configured to exert a force on the interface mass in dependency of a signal provided by the sensor, wherein each of the plurality of active damping systems is connected to the interface mass. The structure may be a projection system of a lithographic apparatus.

17 Claims, 4 Drawing Sheets

DAMPING ARRANGEMENT, ACTIVE DAMPING SYSTEM, LITHOGRAPHIC APPARATUS, AND PROJECTION ASSEMBLY

CROSS-REFERENCE TO RELATED APPLICATION

This application claims priority to U.S. Application 60/996,502 filed on Nov. 20, 2007. The subject matter of that application is incorporated herein by reference as if fully set forth herein.

BACKGROUND

1. Field of Invention

The present invention relates to a combination of a structure and two or more active damping systems, a lithographic apparatus, and a projection assembly.

2. Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to obtain a high accuracy and high resolution currently aimed at in lithography, it is desirable to accurately position parts of the lithographic apparatus such as the reticle stage to hold the patterning device (e.g. mask), the projection system and the substrate table to hold the substrate, with respect to each other. Apart from the positioning of e.g. the patterning device (e.g. reticle) stage and the substrate table, this may also pose requirements on the projection system. The projection system in current implementations may include a carrying structure, such as a lens mount (in case of transmissive optics) or a mirror frame (in case of reflective optics) and a plurality of optical elements such as lens elements, mirrors, etc. In operation, the projection system may be subject to vibrations due to a plurality of causes. As an example, movements of parts in the lithographic apparatus may result in vibrations of a frame to which the projection system is attached, a movement of a stage such as the substrate stage or the patterning device (e.g. reticle) stage, or accelerations/decelerations thereof, which may result in a gas stream and/or turbulence and/or acoustic waves affecting the projection system. Such disturbances may result in vibrations of the projection system as a whole or of parts thereof. By such vibrations, displacements of lens elements or mirrors may be caused, which may in turn result in an imaging error, i.e. an error in the projection of the pattern on the substrate.

Commonly, a damping system is provided to dampen vibrations of the projection system or parts thereof. A passive damping system may be provided as known in many forms, or an active damping system, or a combination of a passive and an active damping system. In this document, the term active damping system is to be understood as a damping system which includes a device to detect or determine an effect of a vibration (e.g. a position sensor, velocity sensor, acceleration sensor, etc) and an actuator to act on the structure to be damped or a part thereof, the actuator being driven by e.g. a controller in dependency of a signal provided by the sensor. By driving the actuator in dependency of the signal provided by the sensor, an effect of the vibration on the projection system or a part thereof, may be reduced or cancelled to a certain extent. An example of such active damping system may be provided by a feedback loop; the sensor provides a position quantity (such as a position, speed, acceleration, jerk, etc of the projection system or a part thereof), which is fed into a controller, the controller generates a controller output signal to drive the actuator, and the actuator in turn acts on the projecting system or the part thereof so that a feedback loop is provided. The controller may be formed by any type of controller and may be implemented in the software to be executed by a microprocessor, microcontroller, or any other programmable device, or may be implemented by dedicated hardware.

It is desirable to obtain stability of the feedback loop, i.e. to achieve a frequency behavior of the feedback loop wherein ringing and/or oscillation is prevented. At the same time, a high bandwidth of the active damping system is desired, as a high bandwidth of the active damping system will allow to suppress vibrations within such high bandwidth. Due to the ever increasing demands on speed of the lithographic apparatus, movements in the lithographic apparatus tend to take place at a higher speed and consequently involving faster transients, which may result in a generation of vibrations at increasingly higher frequencies. Therefore, it is desirable to provide a higher bandwidth of the active damping system.

A phenomenon that is encountered is that the projection system is commonly built up from a variety of parts, including e.g. lenses, mirrors and/or other optical elements, lens mountings and/or mirror mountings, a housing of the projection system such as a lens body, etc. As a consequence, a frequency behavior of the projection system starts, at a low frequency extreme, as a rigid body mass, thereby providing a transfer function from a force acting on the projection system to a velocity of the projection system which is inversely proportional to a frequency, assuming that the frame on which the projection system is mounted is already decoupled from the fixed world. In a resonance frequency range, a resonance of the projection system is observed, which may be followed by a plurality of further resonances with increasing frequency, thereby overall resulting in an increase of the magnitude of the transfer function. Effectively, as from the resonance frequency range, the projection system does not behave as a single object anymore, however instead shows a variety of resonance phenomena each corresponding to resonance of an element of the projection system. As a result thereof, the higher the frequency, the lower the remaining mass which "contributes" to the transfer function, which may be considered an explanation for the fact that the magnitude of the transfer function from a force acting on the projection system to a velocity of the projection system increases with increasing frequency, in the frequency range above the resonance frequency range.

As will be understood by a skilled person, the frequency behavior of the projection system as outlined above may result in stability problems when attempting to achieve a bandwidth of the active damping system high enough to dampen resonances of the projection system. The transfer function may be expressed in terms of e.g. velocity of the projection system as a function of a force on the projection system. It is noted that the transfer function may also be expressed in any other suitable quantity, such as acceleration of the projection system as a result of force on projection system. In that case, a low frequency behavior of the transfer function will show to be frequency independent, followed by a resonance frequency range and an increase of the transfer function (showing multiple resonance peaks) above the resonance frequency range.

When two or more active damping systems are provided to dampen vibrations of a projection system, the overall damping performance is generally increased, in particular as an active damping system often is configured to provide a damping activity in one main direction. Thus by providing two or more active damping system improved damping may be obtained in a corresponding number of directions. However, with increasing demands on damping performance, it has shown that the damping activity of the different active damping systems may influence each other, also caused by the internal dynamics of the projection system. Such mutual influence may still have a negative impact on overall damping performance.

SUMMARY

It is desirable to provide a combination of a structures and two or more active damping systems in which the overall damping performance of the combination of active damping systems is improved.

According to an embodiment of the invention, there is provided a combination of a structure, an interface mass mounted on the structure, and an active damping system or damper to dampen a vibration of at least a part of the structure, including a sensor to measure a position quantity of the interface mass and an actuator to exert a force on the interface mass in dependency of a signal provided by the sensor, wherein the combination includes one or more further active damping systems or dampers each being connected to the interface mass.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate; wherein the lithographic apparatus further includes a combination of a structure, an interface mass mounted on the structure, and an active damping system or damper to dampen a vibration of at least a part of the structure, including a sensor to measure a position quantity of the interface mass and an actuator to exert a force on the interface mass in dependency of a signal provided by the sensor, wherein the combination includes one or more further active damping systems or dampers each being connected to the interface mass.

According to an embodiment of the invention, there is provided a projection assembly including a projection system configured to project a patterned radiation beam onto a target portion of a substrate; an interface mass; and a damping system or damper to dampen a vibration of at least a part of the projection system, the damping system including a sensor to measure a position quantity of the interface mass and an actuator to exert a force on the interface mass in dependency of a signal provided by the sensor, wherein the combination includes one or more further active damping systems or dampers each being connected to the interface mass.

According to an embodiment of the invention, there is provided a combination of a structure, at least one interface mass mounted on the structure, and two or more active damping systems or dampers to dampen a vibration of at least a part of the structure, including a sensor to measure a position quantity of an interface mass and an actuator to exert a force on an interface mass in dependency of a signal provided by the sensor, wherein the combination includes a multivariable controller including a modal decoupling matrix, a number of modal controllers and a modal coupling matrix.

According to an embodiment of the invention, there is provided a method of controlling two or more active damping systems or dampers to dampen a vibration of at least a part of a structure, including mounting at least one interface mass on the structure, and providing a sensor to measure a position quantity of an interface mass and an actuator to exert a force on an interface mass in dependency of a signal provided by the sensor, providing a multivariable controller including a modal decoupling matrix, a number of modal controllers and a modal coupling matrix, and actuating the actuators on the basis of output signals of the sensors, by feeding the output signals to a modal decoupling matrix, the output of the modal decoupling matrix to a number of modal controllers, and feeding the output of the modal controllers to the actuators via the modal coupling matrix.

According to an embodiment of the invention, there is provided an active damping system assembly configured to dampen a vibration of at least part of a structure, the active damping system assembly including a plurality of active dampers each including a sensor configured to measure a position quantity of an interface mass mounted on the structure; and an actuator configured to exert a force on the interface mass in dependency of a signal provided by the sensor, wherein each of the plurality of active dampers is connected to the interface mass.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and an active damping system assembly configured to dampen a vibration of at least part of a structure, the active damping system assembly including a plurality of active dampers each including a sensor configured to measure a position quantity of an interface mass mounted on the structure; and an actuator configured to exert a force on the interface mass in dependency of a signal provided by the sensor, wherein each of the plurality of active dampers is connected to the interface mass.

According to an embodiment of the invention, there is provided a projection assembly including a projection system configured to project a patterned radiation beam onto a target portion of a substrate; an interface mass; and a plurality of active dampers configured to dampen a vibration of at least part of the projection system, each of the plurality of active dampers including a sensor configured to measure a position quantity of the interface mass, and an actuator configured to exert a force on the interface mass in dependency of a signal provided by the sensor, wherein each of the plurality of active dampers is connected to the interface mass.

According to an embodiment of the invention, there is provided an active damping assembly configured to dampen a vibration of at least part of a structure, the active damping assembly including two or more active dampers each including a sensor configured to measure a position quantity of an interface mass mounted on the structure; and an actuator configured to exert a force on an interface mass in dependency of a signal provided by the sensor, and a multivariable controller comprising a modal decoupling matrix, a plurality of modal controllers and a modal coupling matrix.

According to an embodiment of the invention, there is provided a method of controlling two or more active dampers to dampen a vibration of at least a part of a structure including mounting at least one interface mass on the structure; measuring a position quantity of an interface mass using sensors; exerting a force on the interface mass in dependency of a signal provided by the sensors using actuators; providing a multivariable controller comprising a modal decoupling matrix, a plurality of modal controllers and a modal coupling matrix; and actuating the actuators based on output signals of the sensors, by feeding the output signals to the modal decoupling matrix, the output of the modal decoupling matrix to the plurality of modal controllers, and the output of the modal controllers to the actuators via the modal coupling matrix.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
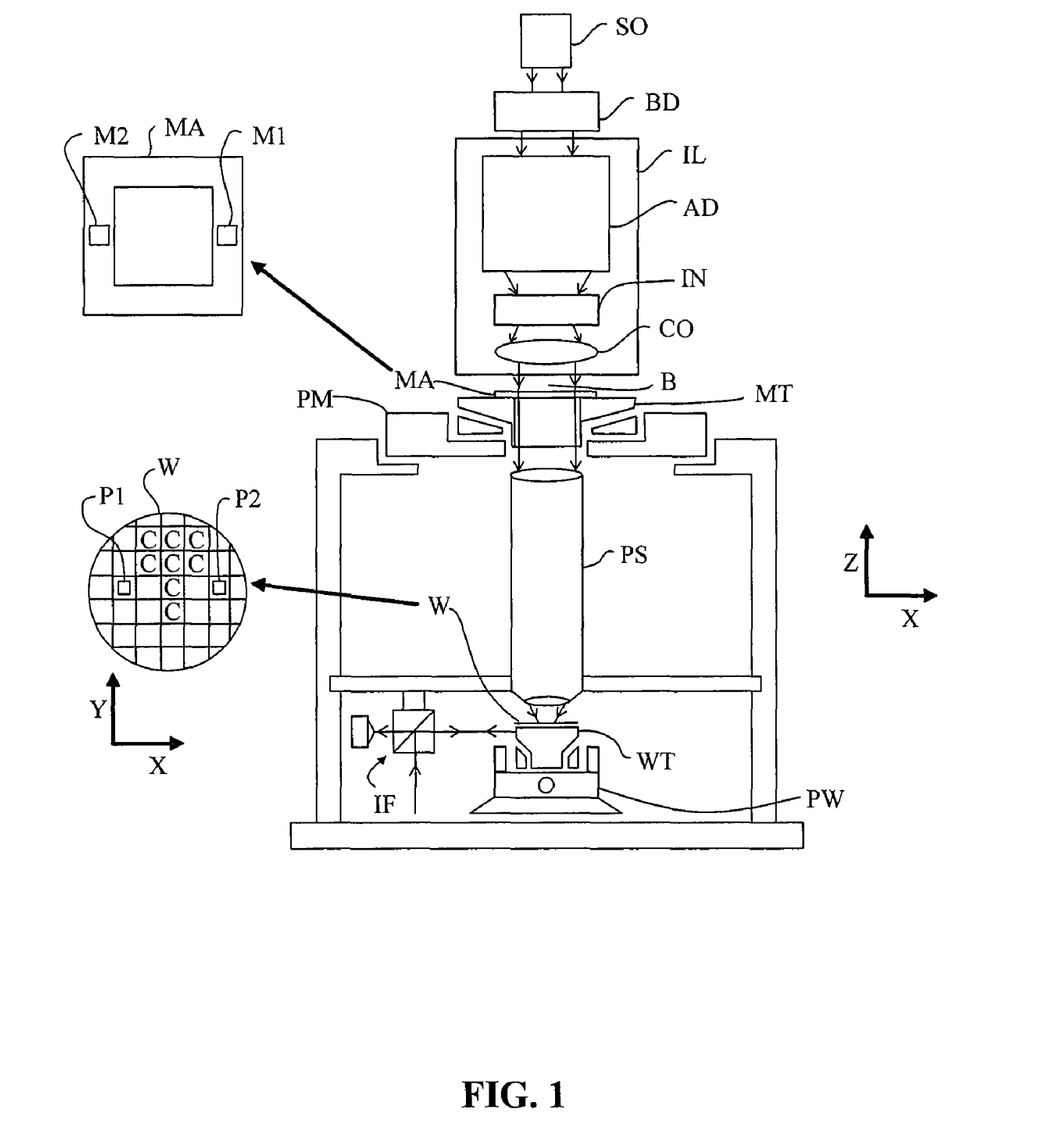
FIG. 1 depicts a lithographic apparatus in which an embodiment of the invention may be incorporated.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or substrate support constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g. mask) MA, which is held on the patterning device support (e.g. mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the patterning device support (e.g. mask table) MT or mask support and the substrate table WT or substrate support are kept essentially stationary, while an entire pattern imparted to the radiation beam is projected onto a target portion C at one time (i.e. a single static exposure). The substrate table WT or substrate support is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or mask support and the substrate table WT or substrate support are scanned synchronously while a pattern imparted to the radiation beam is projected onto a target portion C (i.e. a single dynamic exposure). The velocity and direction of the substrate table WT or substrate support relative to the patterning device support (e.g. mask table) MT or mask support may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or mask support is kept essentially stationary holding a programmable patterning device, and the substrate table WT or substrate support is moved or scanned while a pattern imparted to the radiation beam is projected onto a target portion C. In this mode, generally a pulsed radiation source is employed and the programmable patterning device is updated as required after each movement of the substrate table WT or substrate support or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
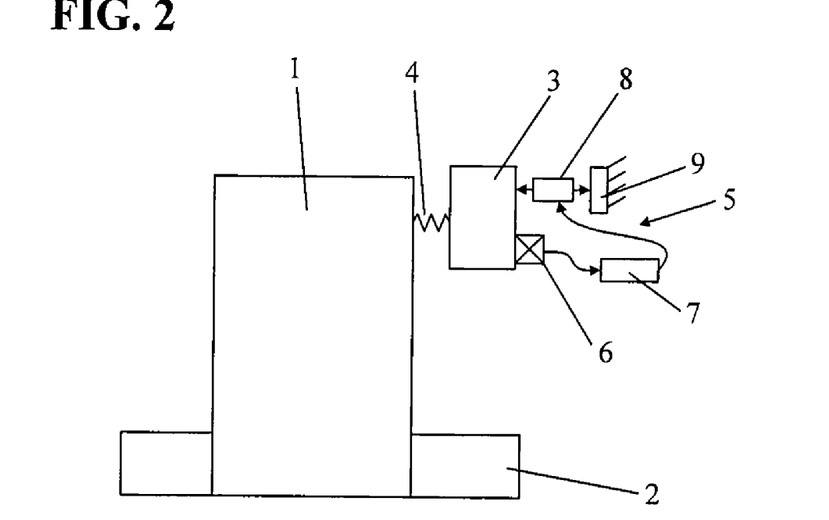
FIG. 2 depicts an active damping system.

FIG. 2 depicts a highly schematic view of a projection system 1, in this example held in a metrology frame 2. A projection system 1 may be held in the metrology frame 2 by any suitable devices, e.g. a rigid mounting, a resilient mounting, etc. An interface mass 3 which may include any object, preferably a rigid mass, is connected to the projecting system 2 by means of a resilient connection 4, preferably a damping connection.

An active damping system 5 is provided for active damping of vibrations of the projection system 1. The active damping system 5 includes a sensor 6, a controller 7 and an actuator 8. The active damping system 5 may be generally termed an active "damper".

A vibration of the projection system 1 results normally in a vibration of the interface mass 3, and will be sensed by a sensor 6. The same holds for a vibration of a part of the projection system (such as a lens element, mirror, or any other part thereof), which may likewise result in a vibration of the interface mass 3. Such vibration may be sensed by the sensor 6, which may be any type of vibration sensor, such as a position measurement sensor, a velocity measurement sensor, an acceleration measurement sensor, etc. An actuator 8 is provided which acts on the interface mass 3 on the basis of the sensor signal.

In the shown embodiment, the actuator 8 is connected between a base frame 9 of the lithographic apparatus (however any other reaction body or other reference may be applied) and the interface mass 3. It is also possible to provide an inertial mass as a reaction mass, i.e. a mass which is connected to the actuator to counteract the forces exerted by the actuator 8 by making use of the inertia of the reaction mass. In that case, the inertial mass may be connected, for example, by leaf springs to interface mass 3 to at least allow movements of the inertial mass in the direction of the reaction force of the actuator 8.

The actuator 8 may be any suitable type of actuator, such as a piezo-electric actuator, a motor, etc, in a preferred embodiment use is made of a Lorentz actuator, as thereby a contactless actuator may be provided which does not provide for a mechanical contact between the base frame 9, other reaction body or reference, and the interface mass 3, as the Lorentz actuator may provide for a contactless exertion with respective parts connected to the base frame 9 and the interface mass 3 respectively.

The actuator 8 is driven using a suitable controller 7 in dependency of a signal provided by the sensor 6.

By providing a resilient connection 4 between the interface mass 3 and the projection system 1, an effective decoupling of the vibrations and resonances of parts of the projection system may be provided in a frequency range above a certain roll-off frequency. By designing the roll-off frequency of the resilient connection 4 (i.e. the frequency above which a transfer of vibrations from the projection system 1 to the interface mass 3 substantially decreases), lower than a bandwidth of the active damping system, i.e. in other words by providing a bandwidth of the active damping system 5 which exceeds the roll-off frequency of connection 4, it is possible to benefit from the substantially resonance free behavior in that frequency band to promote a stable operation of the active damping system 5. The resilient connection 4 between the interface mass 3 and projection system 1 preferably includes a spring, such as a damped spring.

Since the sensor 6 and the actuator 8 are connected to the interface mass 3, instead of directly to the projection system 1, and the interface mass 3 in turn is connected to the projection system 1 via the resilient connection 4, the following effect is obtained. Below a certain roll-off frequency the behavior of the transfer function largely corresponds as if the sensor 6 and actuator 8 were directly mounted on the projection system 1. A vibration of the projection system 1 results in a corresponding vibration in the interface mass 3, and vice versa. Above this frequency the sensor 6 does not or substantially not observe anymore the vibrations and resonances of the projection system 1, or parts thereof, since the frequency behavior, as observed from the actuator 8 to the sensor 6, is substantially decoupled from the projection system due to the resilient connection 4.

Figure 3:
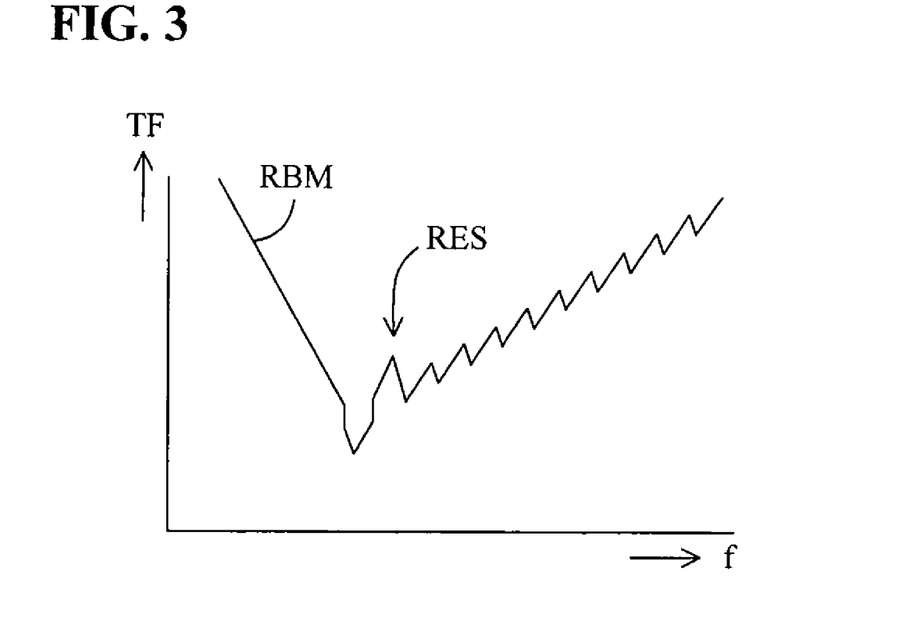
FIG. 3 depicts a frequency plot of a transfer function of a projection system of the lithographic apparatus.

FIG. 3 depicts a frequency plot of a transfer function of a projection system of the lithographic apparatus. The plot in FIG. 3 is an example of a transfer function TF from a force acting on the projection system 1 to a velocity of the projection system 1 which is inversely proportional to a frequency f, assuming that the frame on which the projection system is mounted is already decoupled from the fixed world. In a resonance frequency range, a resonance RES of the projection system is observed, which may be followed by a plurality of further resonances with increasing frequency, thereby overall resulting in an increase of the magnitude of the transfer function.

Below the resonance frequency the projection system behaves as a rigid body mass RBM, but from the resonance frequency range, the projection system does not behave as a single object anymore, however instead shows a variety of resonance phenomena each corresponding to resonance of an element of the projection system. As a result thereof, the higher the frequency, the lower the remaining mass which "contributes" to the transfer function, which may be considered an explanation for the fact that the magnitude of the transfer function from a force acting on the projection system to a velocity of the projection system increases with increasing frequency, in the frequency range above the resonance frequency range.

Figure 4:
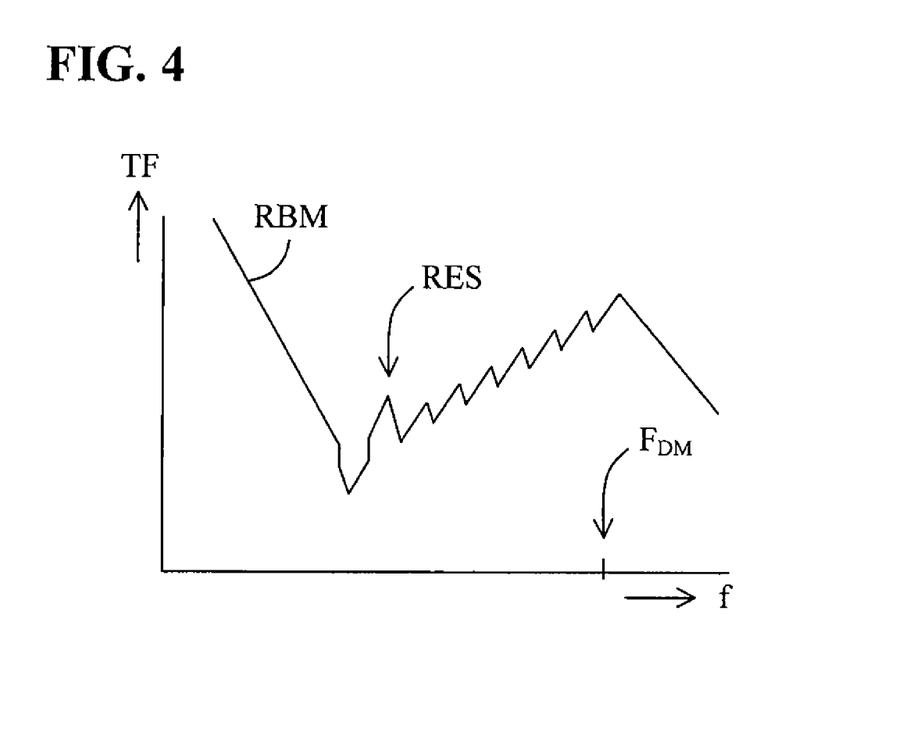
FIG. 4 depicts a frequency plot of a transfer function of a projection system of the lithographic apparatus, as observed by the active damping system according to FIG. 2.

FIG. 4 depicts a frequency plot of a transfer function of a projection system of the lithographic apparatus, as observed by the active damping system according to FIG. 2. This figure shows a transfer function TF from a force acting on the interface mass 3 to a velocity of the interface mass 3. Below a roll-off frequency $F_{DM}$, a behavior of the transfer function largely corresponds to that as depicted in FIG. 3, as below the frequency $F_{DM}$, a vibration of the projection system 1 results in a corresponding vibration in the interface mass 3, and vice versa. As of the frequency $F_{DM}$ the sensor 6 and actuator 8 do not or substantially not observe anymore the vibrations and resonances of the projection system 1, or parts thereof, instead the frequency behavior, as observed from the sensor 6 and the actuator 8, is dominated by the interface mass 3. Thus, FIG. 4 shows three frequency bands: a low frequency region RBM where the projection system behaves as rigid body mass, a resonant part RES and resonances of the projection system, and again a rigid body mass being provided by the interface mass 3. As a consequence, a phase of the transfer function as of the frequency $F_{DM}$ will show a more constant behavior, thereby possibly favoring a stable behavior of the active damping system including the sensor 6 and the actuator 8.

Thus, by providing interface mass 3 between the sensor 6/actuator 8 and the projection system, unfavorable high frequency behavior of the projection system 1 is no longer taken into account in the control loop of the active damping system 5. In practice, for even higher frequencies, the interface mass 3 may itself again show resonances. These resonances however should be beyond an effective bandwidth of the active damping system 5. As the interface mass 3 may have a weight and complexity lower than that of the projection system 1, such behavior my easily be achieved in a practical implementation.

The interface mass 3 may be connected to any relevant part of the projection system 1, in a practical implementation of a transmissive projection system, the interface mass may be connected to a lens mount (i.e. a mount for a plurality of lens elements thereof). In the case of a reflective projection system, the interface mass may be connected e.g. to a frame holding one or more of the mirrors. Thereby, the projection system and its constituting parts may be effectively damped, as connecting the interface mass (and therefore mediately connecting the active damping system) to the lens mount or frame will have effect on a plurality of constituting parts of the projection system, e.g. lens elements, mirrors, etc, as these constituting elements are all in turn connected to the lens mount or reference frame.

A mass of the interface mass 3 may typically be selected between 0.001 and 0.1 times a mass of the projection system 1, more preferably between 0.001 and 0.01 times the mass of the projection system 1, as thereby the roll-off frequency can be provided in a frequency range being within a desired bandwidth of the active damping system 5, thereby favoring a stable closed loop operation of the active damping system 5. The resulting mass of the interface mass 3 is typically in the range of 5-20 kg, for instance 10 kg.

The above described active damping system is described in more detail in the co-pending application having U.S. application No. 60/960,579, the contents of which is herein incorporated in its entirety by reference.

In the FIG. 2 embodiment only one active damping system 5 is shown mounted on the projection system 1. Such active damping system 5 provides damping at one location on the projection system 1 and typically mainly in one direction. In many applications damping at more locations and in more than one direction is desired.

In such applications, it is possible to provide two or more active damping systems 5 at different locations on the projection system, each active damping system having its own interface mass 3 and controller 8. However, the provision of two or more active damping systems 5 may have the result that the damping activity of the different active damping systems may influence each other. Even when the main directions of the active damping systems are directed at orthogonal directions, the internal dynamics of the projection system 1 may result in mutual influence of the damping performance of the active damping systems 5. Embodiments of the present invention provide further improvements to improve damping performance of a combination of a structure and two or more active damping systems or dampers 5, which improvements in particular are directed at taking into account the mutual influence of the two or more active damping systems or dampers 5.

Figure 5:
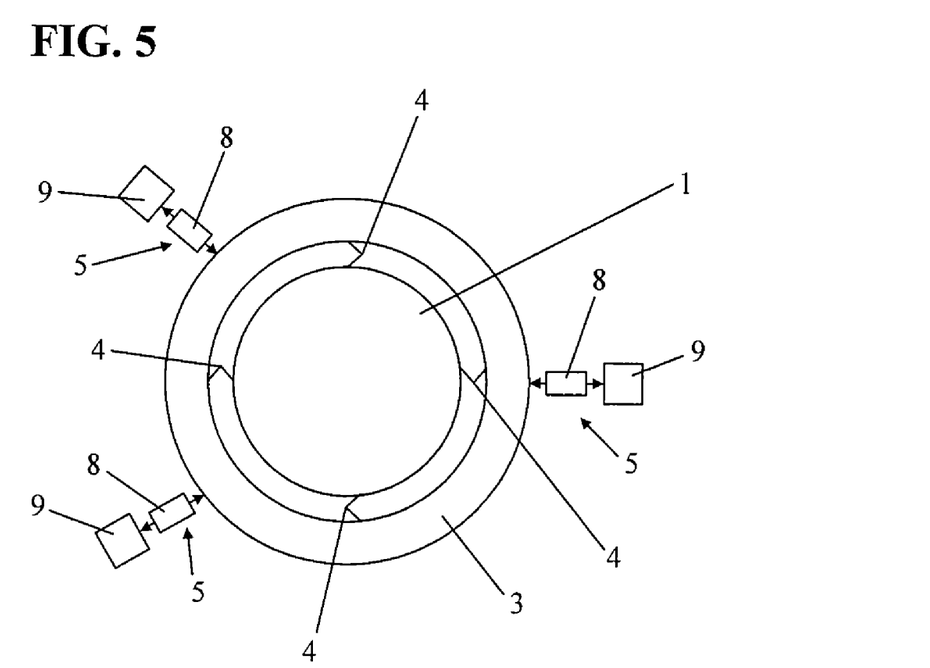
FIG. 5 depicts a combination of a projection system, an interface mass and three active damping systems.

FIG. 5 shows a top view of a projection assembly including a projection system 1, an interface mass 3, and three active damping systems or dampers 5 each including a sensor 6 (not shown in FIG. 5), and actuator 8. The combination of the three active damping systems or dampers forms an active damping system assembly. The sensors 6 and actuators 8 of each of the active damping systems or dampers 5 are connected to the same interface mass 3. The interface mass 3 is mounted on the projection system 2 at four resilient mounting locations 4 which are evenly distributed about the circumference of the projection system 1.

As a result, the reaction forces of each active damping system or damper 5 exerted on the projection system 2 via the interface mass 3 are distributed over the resilient connections 4 at different locations on the projection system 1. Also, the position quantity measured by each sensor 6 is determined by the movement of the interface mass via the four resilient connections 4. As such, the damping performance of the active damping system 5 is less dependent on the specific location at which a single interface mass of a single active damping system 5 is connected to the projection system 1. This is in particular relevant since the projection system dynamics as seen by the active damping system 5 is highly dependent on the specific mounting location of the active damping system 5. By distributing the mounting locations around the projection system, the damping activity becomes less dependent on specific projection system dynamics at a certain mounting location, and therewith the overall damping performance increases.

The interface mass 3 is substantially ring-shaped and surrounds the projection system 2. As such, the interface mass 3 is built in a very efficient way in the lithographic apparatus. Furthermore, as only one interface mass 3 is used for three active damping systems 5, which may have substantially the same mass as would be needed for an interface mass for a single active damping system, the total mass of the interface mass is substantially three times smaller. Thus, the total volume of interface mass 3 is smaller and the volume is incorporated in a very efficient way in the lithographic apparatus.

In the embodiment of FIG. 5 three active damping systems or dampers 5 are shown using a single interface mass 3. In alternative embodiments two or more interface masses may be provided, wherein at least one of the interface masses 3 is used for two active damping systems 5. For instance, six active damping systems or dampers 5 and two ring shaped interface masses 3 may be provided, each of the interface masses 3 being connected to three active damping systems 5. Preferably, one single interface mass 3 is provided for all active damping systems 5 or one interface mass 3 is provided for a number of active damping systems 5 in substantially the same plane. In such embodiment the shown ring-shaped interface mass 5 is in particular suitable as interface mass 3.

Preferably, the active damping systems are evenly distributed about the circumference of the projection system 1, as well as the mass of the interface mass 3. Also, it is preferred to evenly distribute the resilient connections 4 between each interface mass 3 and the projection system 1.

Four resilient connections 4 as shown are sufficient for proper mounting of the interface mass 3 on the projection system 1. Any other number of resilient connections 4 may also be applied.

In the embodiment as shown in FIG. 2, the active damping system 1 may use a single-input single output controller for driving the actuator in dependence on the measured signal of the sensor 6.

In a system with multiple active damping systems 5, the controller of each active damping system may be configured to minimize the acceleration in a certain direction and at a specific location on the projection system. However, the damping activity of a first active damping system may also influence the position of the interface mass 3 and/or projection system and therewith the behavior of the other active damping system. This may also be the case when a single interface mass 3 is used for multiple active damping systems 5 as shown in FIG. 5. Thus, even though the controller may be optimized for damping performance of a single active damping system or damper 5, the mutual influence between the different may have a negative influence on the overall damping performance of the combination of projection system 1, one or more interface masses 3 and active damping systems 5.

Figure 6:
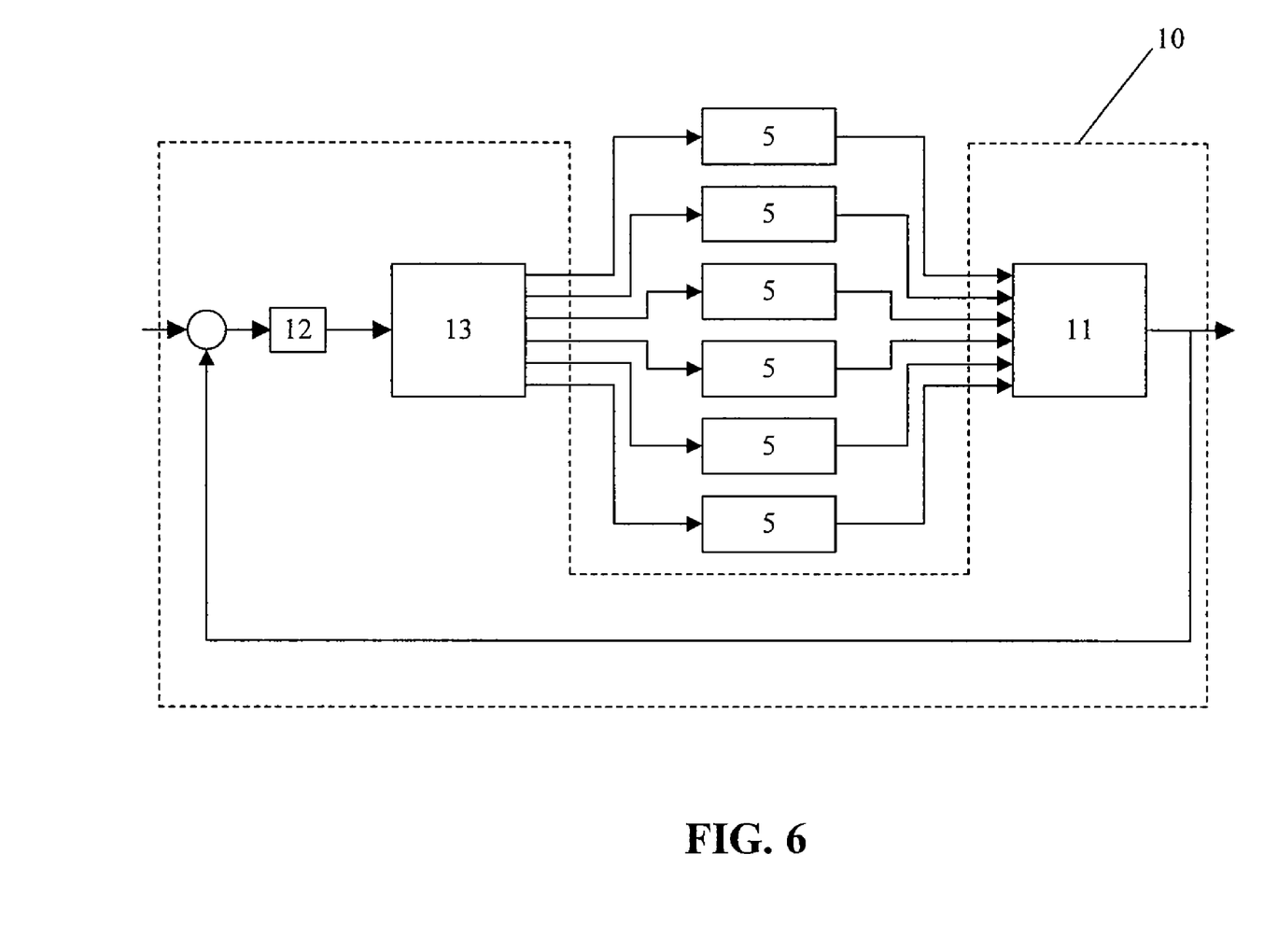
FIG. 6 depicts a control scheme for actuation of the actuators of a combination of a structure and two or more active damping systems.

FIG. 6 shows a control scheme for six active damping systems 5 mounted on a projection system, wherein the mutual influence of the active damping systems 5 is taken into account. The control scheme uses a multivariable controller 10. The controller 10 includes a modal decoupling matrix 11, a matrix of six modal controllers 12 and a modal coupling matrix 13. Such multivariable controllers are known per se. The controller 10 may for instance be used (in a 3×3 version) for the control of the active damping systems of FIG. 5.

The outputs of each of the sensors 5 of the active damping systems 5 are fed into decoupling matrix 11 to transform the signals of the sensors 5 into six independent vibration modes. The vibration modes are configured such that they do not influence each other. The output signals of the modal decoupling matrix 11 are fed to a set of modal controllers 12 each controller being configured to control one of the vibration modes, possibly after being subtracted from a reference signal.

The modal controllers 12 provide for each of the modes an independent control signal which is fed into a modal coupling matrix 13 transforming the control signals to signals in correspondence with the main directions of the active damping systems 5. After transformation the signals are used as input for the actuator 8 of the respective active damping system 5.

The modal decoupling matrix is based on the dynamics of the system which is controlled, i.e. the dynamics of projection system and interface mass between the actuator and the sensor. The modal coupling matrix is the inverted matrix of the decoupling matrix. The modal controllers may be any type of suitable controllers, for instance PI controllers.

By providing a multivariable controller 10 using a decoupling matrix 11 and coupling matrix 13, the control coordinates coincide with the modal shapes of the projection system and interface mass. As a result the open-loop transfer function of each modal controller 12 is more favorable, therewith enabling an improved damping performance of the active damping systems 5.

The multivariable controller may be used for multiple active damping systems each being connected to the projection system via its own interface mass as well as for multiple active damping systems wherein two or more active damping systems share an interface mass.

The controller and controlling method may be included in software to be executed on any general computer, such as a mainframe computer, personal computer or the like and pursuant to one or more, or a part of one or more, program modules or objects generated from any programming language, such as C++, Java, Fortran or the like. Each step, or a file or object or the like implementing each step, may be executed by special purpose hardware or a circuit module designed for that purpose. For example, the invention may be implemented as a firmware program loaded into non-volatile storage or a software program loaded from or into a data storage medium as machine-readable code, such code being instructions executable by an array of logic elements such as a microprocessor or other digital signal processing unit.

Although in the above, the invention has been described with reference to a projection system of a lithographic apparatus, the invention may be applied to any projection system, or even more generally to any structure which is to be mechanically damped by a number of active damping systems. Thus, the invention as well as the embodiments described in this document may be provided as a lithographic apparatus including a projection system and a number of active damping systems, as a projection assembly including a projection system and a number of active damping systems, and as a combination of a structure and a number of active damping systems to dampen vibrations of the structure.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An active damping assembly configured to dampen a vibration of at least part of a structure, the active damping system assembly comprising:
    an interface mass mounted on the structure;
    active dampers each including:
    a sensor connected to the interface mass and configured to measure a position of the interface mass; and
    an actuator mounted between a reaction body and the interface mass, wherein the actuator is configured to exert a force on the interface mass based on a signal provided by the sensor,
    wherein each of the active dampers is connected directly or indirectly to the interface mass, and
    wherein the interface mass surrounds the structure.

2. The active damping assembly of claim 1, wherein the number of active dampers is two.

3. The active damping assembly of claim 1, wherein the interface mass is resiliently mounted on the structure.

4. The active damping assembly of claim 1, wherein the interface mass is ring-shaped.

5. The active damping assembly of claim 1, wherein the active dampers are substantially evenly distributed about the circumference of a projection system.

6. The active damping assembly of claim 5, wherein the interface mass comprises two or more mounting locations on the structure, and wherein each mounting location comprises a resilient connection.

7. The active damping assembly of claim 6, wherein the mounting locations are substantially evenly distributed about the circumference of the projection system.

8. The active damping assembly of claim 1, comprising four or more active dampers, wherein two or more interface masses are each resiliently mounted on a projection system and at least two of the four or more active dampers are connected to each of the two or more interface masses.

9. The active damping assembly of claim 1, wherein the structure is a projection system.

10. A lithographic apparatus comprising:
an illumination system configured to condition a radiation beam;
a support constructed to support a patterning device, the patterning device being constructed and arranged to impart the radiation beam with a pattern in its cross-section to form a patterned radiation beam;
a substrate table constructed to hold a substrate;
a projection system configured to project the patterned radiation beam onto a target portion of the substrate; and
an active damping system assembly configured to dampen a vibration of at least part of a structure, the active damping system assembly comprising:
an interface mass mounted on the structure;
a plurality of active dampers each including
a sensor connected to the interface mass and configured to measure a position quantity of the interface mass; and
an actuator mounted between a reaction body and the interface mass,
wherein the actuator is configured to exert a force on the interface mass in dependency of a signal provided by the sensor,
wherein each of the plurality of active dampers is connected to the interface mass, and
wherein the interface mass surrounds the structure.

11. The lithographic apparatus of claim 10, wherein the structure is the projection system.

12. An active damping assembly according to claim 1 further comprising:
a multivariable controller comprising a modal decoupling matrix, a plurality of modal controllers and a modal coupling matrix, the controller being constructed and arranged to obtain information from the sensor and control the actuator.

13. The active damping assembly system of claim 12, wherein the structure is a projection system.

14. The active damping assembly system of claim 13, wherein the projection system is part of a lithographic apparatus.

15. A method of controlling two or more active dampers to dampen a vibration of at least a part of a structure, comprising:
mounting at least one interface mass on the structure that surrounds the structure;
measuring a position of the interface mass using sensors connected to the interface mass;
exerting a force on the interface mass in response to a signal provided by the sensors using actuators;
providing a multivariable controller comprising a modal decoupling matrix, a plurality of modal controllers and a modal coupling matrix; and
actuating the actuators based on output signals of the sensors, by feeding the output signals to the modal decoupling matrix, the output of the modal decoupling matrix to the plurality of modal controllers, and the output of the modal controllers to the actuators via the modal coupling matrix.

16. The method of claim 15, wherein providing a multivariable controller determines the modal coupling and decoupling matrix based on dynamics of the structure and the interface mass.

17. An active damping assembly according to claim 1 wherein there are at least two active dampers, each comprising at least one sensor and at least one actuator.

* * * * *